(12) United States Patent
Bai et al.

(10) Patent No.: US 11,152,600 B2
(45) Date of Patent: Oct. 19, 2021

(54) ORGANIC LIGHT-EMITTING DIODE DISPLAY PANEL AND MANUFACTURE METHOD THEREOF

(71) Applicant: Wuhan China Star Optoelectronics Semiconductor Display Technology Co., Ltd., Wuhan (CN)

(72) Inventors: Yamei Bai, Wuhan (CN); Jinchang Huang, Wuhan (CN); Yu Gu, Wuhan (CN); Jiajia Luo, Wuhan (CN); Lin Yang, Wuhan (CN); Xianjie Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 114 days.

(21) Appl. No.: 16/603,843

(22) PCT Filed: May 13, 2019

(86) PCT No.: PCT/CN2019/086607
§ 371 (c)(1),
(2) Date: Oct. 9, 2019

(87) PCT Pub. No.: WO2020/124939
PCT Pub. Date: Jun. 25, 2020

(65) Prior Publication Data
US 2020/0280024 A1    Sep. 3, 2020

(30) Foreign Application Priority Data
Dec. 20, 2018  (CN) .......................... 201811565832.2

(51) Int. Cl.
*H01L 51/56* (2006.01)
*H01L 51/52* (2006.01)

(52) U.S. Cl.
CPC .......... *H01L 51/56* (2013.01); *H01L 51/5246* (2013.01); *H01L 51/5253* (2013.01); *H01L 51/5259* (2013.01); *H01L 2251/303* (2013.01)

(58) Field of Classification Search
CPC ..................................................... H01L 51/56
USPC ........................................................ 257/40
See application file for complete search history.

(56) References Cited

U.S. PATENT DOCUMENTS

| 2006/0146256 A1* | 7/2006 | Ahn .................. G02F 1/134309 349/141 |
| 2014/0145585 A1 | 5/2014 | Choi et al. |
| 2014/0159002 A1* | 6/2014 | Lee ..................... H01L 51/5256 257/40 |
| 2015/0303393 A1 | 10/2015 | Dai et al. |

FOREIGN PATENT DOCUMENTS

| CN | 103187434 | | 7/2013 |
| CN | 108511631 | | 9/2018 |
| CN | 108511631 A | * | 9/2018 |

* cited by examiner

*Primary Examiner* — Ajay Arora

(57) ABSTRACT

An organic light-emitting diode (OLED) display panel and a manufacture method thereof are provided, which can enable the organic material encapsulated inside to have the function of removing water and oxygen, thereby further ensuring a reliable lifespan of the OLED display panel.

10 Claims, 2 Drawing Sheets

ORGANIC LIGHT-EMITTING DIODE DISPLAY PANEL AND MANUFACTURE METHOD THEREOF

RELATED APPLICATIONS

This application is a National Phase of PCT Patent Application No. PCT/CN2019/086607 having International filing date of May 13, 2019, which claims the benefit of priority of Chinese Patent Application No. 201811565832.2 filed on Dec. 20, 2018. The contents of the above applications are all incorporated by reference as if fully set forth herein in their entirety.

FIELD AND BACKGROUND OF THE INVENTION

The present disclosure relates to the field of display technologies, and in particular, to an organic light-emitting diode (OLED) display panel and a manufacturer method thereof.

Organic light-emitting diodes (OLEDs) have many advantages, such as thin, light, bendable, wide viewing angles, fast response times, and high luminous efficiency, which have become a new generation display technology with broad development prospects.

The existing OLED display panel usually includes an array substrate and an encapsulation layer. A surface of the array substrate is provided with a pixel definition layer. The pixel definition layer has a plurality of notches, and each of the notches is provided with an OLED light emitting device. The encapsulation layer covers one side of the pixel definition layer, so as to isolate the OLED light emitting device from an external environment, thereby preventing the OLED light emitting device from being affected by water and oxygen in the external environment. To this end, encapsulation materials of the OLED display panel have been further researched and developed.

In addition to the encapsulation materials of the OLED display panel must have excellent moisture and oxygen barrier properties, organic materials encapsulated inside also require the ability to remove water and oxygen. This is because organic light-emitting layer materials and cathode metal materials of the OLED display panel are easily corroded by water and oxygen in the environment. The material of the organic light-emitting layer of the OLED itself contains a certain amount of moisture, so that the certain amount of moisture is sealed between the array substrate and the encapsulation layer during the process. This moisture is released to the OLED display panel, causing the OLED display panel to be damaged by moisture absorption, thereby shortening lifespan of the OLED display panel.

Therefore, how to make the organic materials encapsulated inside also have excellent water and oxygen removal capacity has become a key research topic for researchers.

SUMMARY OF THE INVENTION

An object of the present disclosure to provide an OLED display panel and a manufacturer method thereof, which can enable an organic material encapsulated inside to have water and oxygen removal capability, thereby further ensuring a reliable lifespan of the OLED display panel.

According to one aspect of the present disclosure, the present disclosure provides an organic light-emitting diode (OLED) display panel, including an array substrate, a pixel definition layer disposed on the array substrate, and an encapsulation layer, where the pixel definition layer is encapsulated between the encapsulation layer and the array substrate, and a water absorption layer is disposed over the pixel definition layer, and the water absorption layer is configured to remove moisture between the array substrate and the encapsulation layer; the OLED display panel further includes an adhesive layer, the adhesive layer is disposed between the water absorption layer and the pixel definition layer, and the adhesive layer is configured to attach the water absorption layer to the pixel definition layer; and the water absorption layer includes a mixture of at least one of an oxide and a chloride and a water-absorbent resin, and the water-absorbent resin is selected from the group consisting of poly-acrylates, polyvinyl alcohols, polyoxyalkylenes, polyurethanes, general-purpose acrylates, and casein.

According to another aspect of the present disclosure, the present disclosure provides an organic light-emitting diode (OLED) display panel, including an array substrate, a pixel definition layer disposed on the array substrate, and an encapsulation layer, where the pixel definition layer is encapsulated between the encapsulation layer and the array substrate, and a water absorption layer is disposed over the pixel definition layer, and the water absorption layer is configured to remove moisture between the array substrate and the encapsulation layer.

In one embodiment of the present disclosure, the OLED display panel further includes an adhesive layer, and the adhesive layer is disposed between the water absorption layer and the pixel definition layer, and the adhesive layer is configured to attach the water absorption layer to the pixel definition layer.

In one embodiment of the present disclosure, the water absorption layer includes a mixture of at least one of an oxide and a chloride and a water-absorbent resin.

In one embodiment of the present disclosure, the water-absorbent resin is selected from the group consisting of poly-acrylates, polyvinyl alcohols, polyoxyalkylenes, polyurethanes, general-purpose acrylates, and casein.

In one embodiment of the present disclosure, the oxide is selected from the group consisting of calcium oxide and aluminum oxide.

In one embodiment of the present disclosure, the adhesive layer is made of an organic material.

According to another aspect of the present disclosure, the present disclosure provides a display device including the above OLED display panel.

According to another aspect of the present disclosure, the present disclosure provides a manufacture method of an OLED display panel, including: providing an array substrate; forming an anode on a surface of the array substrate; forming a pixel definition layer on the array substrate with the anode, where the pixel definition layer is provided with a notch exposing the anode; forming an organic light-emitting diode layer in the notch; forming a cathode on the organic light-emitting diode layer; forming a water absorption layer over the pixel definition layer; and forming an encapsulation layer such that the water absorption layer, the organic light-emitting diode layer, and the cathode are encapsulated between the array substrate and the encapsulation layer.

In one embodiment of the present disclosure, before the step of forming the water absorption layer over the pixel definition layer, the method further includes: forming an adhesive layer on the pixel definition layer.

In one embodiment of the present disclosure, the adhesive layer is made of an organic material.

An advantage of the present disclosure is that the OLED display panel of the present disclosure further protects the organic material inside the encapsulation layer from water and oxygen by setting a water absorption layer on the pixel definition layer, thereby further ensuring the reliable lifespan of the OLED display panel. The display device of the present disclosure also has the above advantage.

BRIEF DESCRIPTION OF THE SEVERAL VIEWS OF THE DRAWINGS

In order to more clearly describe the technical solutions of the embodiments of the present disclosure, the drawings to be used in the descriptions of the embodiments will be briefly introduced as follows. Apparently, the following drawings just illustrate some embodiments of the present disclosure, and a person skilled in the art can obtain other drawings based on these drawings without creative efforts.

DESCRIPTION OF SPECIFIC EMBODIMENTS OF THE INVENTION

Figure 1:
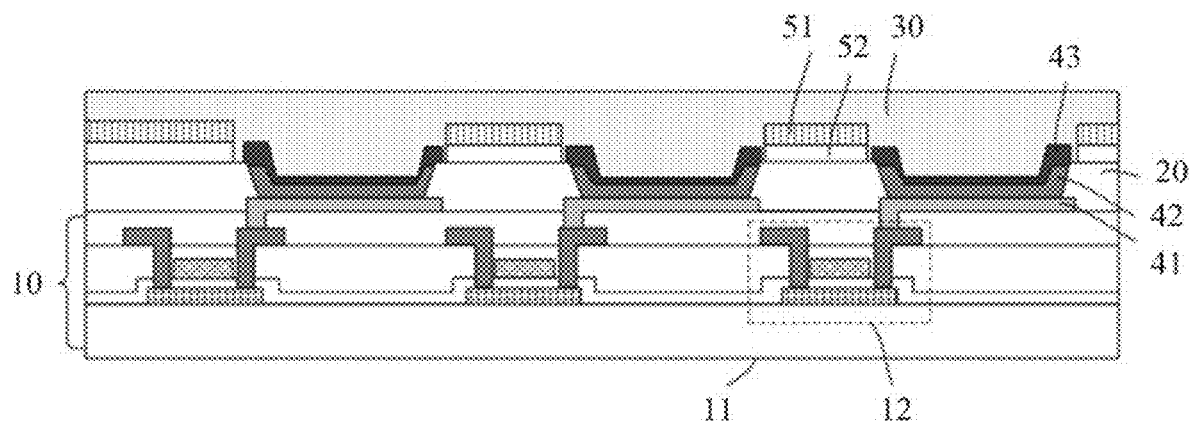
FIG. 1 is a schematic diagram of an OLED display panel according to an embodiment of the present disclosure.
Figure 2:
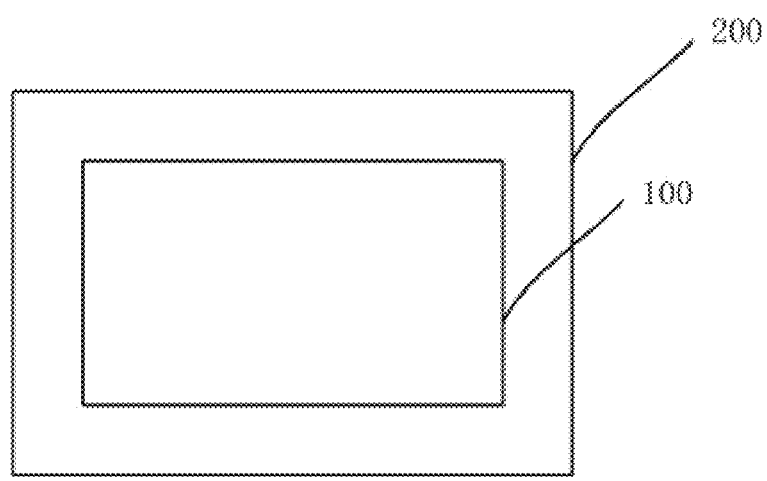
FIG. 2 is a schematic diagram of a display device according to an embodiment of the present disclosure.

The technical solutions according to the embodiments of the present disclosure will be described below clearly and fully with reference to the drawings in the embodiments of the present disclosure. Apparently, the embodiments described below are only a part but not all of the embodiments of the present disclosure. Based upon the embodiments here of the present disclosure, all the other embodiments which can occur to those skilled in the art without any creative effort shall fall into the scope of the present disclosure.

In the specification, claims, and accompanying drawings of the present disclosure, the terms "first", "second", "third", and the like (if existent) are intended to distinguish between similar objects but do not necessarily indicate a specific sequence. It should be understood that the described objects in such a way is interchangeable in proper circumstances. Moreover, the terms "include", "contain" and any other variants mean to cover the non-exclusive inclusion.

The drawings, which are discussed below, and the various embodiments used to describe the principles of the present disclosure are intended to be illustrative only and not to limit the scope of the disclosure. Those skilled in the art will appreciate that the principles of the disclosure may be implemented in any suitably arranged system. Exemplary embodiments will be described in detail, examples of which are illustrated in the accompanying drawings. Further, a terminal according to an exemplary embodiment will be described in detail with reference to the accompanying drawings. The same reference numerals in the drawings denote the same elements.

The terms used in the description of the present disclosure are intended to describe a particular embodiment only and are not intended to illustrate the concept of the disclosure. Expressions used in the singular encompass the plural forms of expression unless the context clearly dictates otherwise. In the description of the present disclosure, it is to be understood that the terms such as "include", "contain", "have" are intended to mean that there is a possibility that the features, numbers, steps, acts, or combinations thereof disclosed in the description of the present disclosure are not intended to exclude one or more the possibility of other features, numbers, steps, actions or combinations thereof. The same reference numerals in the drawings denote the same parts.

Embodiments of the present disclosure provide an OLED display panel and a manufacturer method thereof. The details will be described separately below.

As shown in FIG. 1, in an embodiment of the present disclosure, an OLED display panel 100 is provided. The OLED display panel 100 includes an array substrate 10, a pixel definition layer 20 disposed on the array substrate 10, and an encapsulation layer 30. The pixel definition layer 20 is encapsulated between the encapsulation layer 30 and the array substrate 10. A water absorption layer 51 is disposed over the pixel definition layer 20. The water absorption layer 51 is configured to remove moisture between the array substrate 10 and the encapsulation layer 30, so that the OLED moisture absorption can be avoided, which is beneficial to a lifespan of the OLED display panel 100. The water absorption layer 51 includes a mixture of at least one of an oxide and a chloride and a water-absorbent resin. The oxide, the chloride, and the water-absorbent resin have a strong absorption capacity for water, and can remove moisture between the array substrate 10 and the encapsulation layer 30. The oxide and the chloride gradually become liquid after absorbing a large amount of water, and the liquid easily flow to an organic light-emitting diode layer 42 or a cathode 43. The water-absorbent resin has a good water retention function, and the formed liquid can be kept in the water-absorbent resin, thereby preventing the liquid from flowing to the organic light emitting diode or the cathode 43 to cause damage. Furthermore, the water-absorbent resin is selected from the group consisting of poly-acrylates, polyvinyl alcohols, polyoxyalkylenes, polyurethanes, general-purpose acrylates, and casein, but is not limited thereto. The oxide includes at least one of calcium oxide and aluminum oxide, which is convenient to obtain and low in cost. The chloride may include at least one of zinc chloride, calcium chloride, and tin chloride, which has strong moisture absorption capacity, can better remove moisture in the OLED display panel 100, and increase the lifespan of the OLED display panel 100. It should be noted that if the material of the water absorption layer is replaced with a material that can be used for oxygen removal, that is, the layer is an oxygen scavenging layer, the oxygen permeating between the encapsulation layer and the array substrate can be better removed to further guarantee the lifespan of the OLED display panel 100.

Furthermore, the OLED display panel 100 further includes an adhesive layer 52 disposed between the water absorption layer 51 and the pixel definition layer 20, and the adhesive layer 52 is configured to enable the water absorption layer 51 to be better attached to the pixel definition layer 20. The adhesive layer 52 is made of an organic material. In other embodiments, the adhesive layer 52 can also be made of an inorganic material.

In this embodiment, by arranging the water absorption layer 51, the moisture between the array substrate 10 and the encapsulation layer 30 can be better absorbed, thereby preventing the OLED from absorbing moisture. In other embodiments, a desiccant may be disposed in the encapsulation layer 30. Since a small amount of moisture is present in an outside air, a conventional encapsulation layer may provide a certain isolation function to prevent moisture in the outside air from contacting the inside of the OLED display panel 100. However, the moisture in the air will still slowly penetrate into the interior of the OLED display panel 100. After the desiccant is disposed in the encapsulation layer 30, the moisture is confined in the encapsulation layer 30 and cannot be further penetrated, thereby improving the ability of the encapsulation layer 30 to insulate the external moisture, further preventing external moisture from entering the interior of the OLED display panel 100.

In addition, in other embodiments, the OLED display panel 100 further includes a surface encapsulation layer (not shown). The surface encapsulation layer is coated on the encapsulation layer 30. The surface encapsulation layer is not provided with a desiccant. After the surface encapsulation layer is disposed, in the environment with high humidity, the surface encapsulation layer is isolated from the external environment for the first time, which can prevent the encapsulation layer from absorbing too much water from the external environment.

The array substrate 10 may include a base substrate and a plurality of thin film transistors disposed on the base substrate, and the plurality of thin film transistors may be distributed in an array on the base substrate. The array substrate 10 is provided with anodes 41 of the OLEDs distributed in an array, and each of the anodes 41 is connected to a source or a drain of one of the thin film transistors.

The base substrate may be a transparent substrate such as a glass substrate, a silicon substrate, or a plastic substrate. The thin film transistor may be an amorphous silicon thin film transistor, a low temperature polysilicon thin film transistor, or a metal oxide thin film transistor. Alternatively, the anode 41 may be selected from materials having good electrical and chemical stability, such as indium tin oxide, silver, nickel oxide, graphene, etc., and a thickness of the anode 41 may be 1 to 2 µm. Each of the anodes 41 may correspond to one thin film transistor, and the anodes 41 are distributed on the array substrate 10 in the array.

The pixel definition layer 20 may be made of a transparent insulating material. For example, the transparent insulating material may be polyimide, silicon nitride, or silicon oxide. A plurality of notches exposing the anodes 41 are provided at positions of the pixel definition layer 20 corresponding to the anodes 41. Each notch is uniformly provided with an organic light-emitting diode layer 42. The organic light-emitting diode layer 42 includes, but is not limited to, a hole injection layer, a hole transport layer, an organic light-emitting layer, an electron transport layer, and an electron injection layer which are sequentially disposed on the anode 41. Each notch on the pixel definition layer 20 corresponds to a sub-pixel. A cathode 43 is provided on the organic light-emitting diode layer 42. In this embodiment, the cathode 43 may be made of a metal material having high electrical properties, such as metallic silver.

The encapsulation layer 30 may be an encapsulation layer base material, and the encapsulation layer base material includes one of polyethylene terephthalate, polycarbonate, polystyrene, and polymethyl methacrylate. These encapsulation layer base materials can better isolate external moisture and prevent moisture from penetrating into the OLED display panel 100. In other embodiments, the encapsulation layer 30 can also be made of the encapsulation layer base material and the desiccant.

According to another aspect of the present disclosure, there is provided a display device including the above OLED display panel 100. The specific structure of the OLED display panel 100 is as described above, and will not be described in detail herein.

Figure 3:
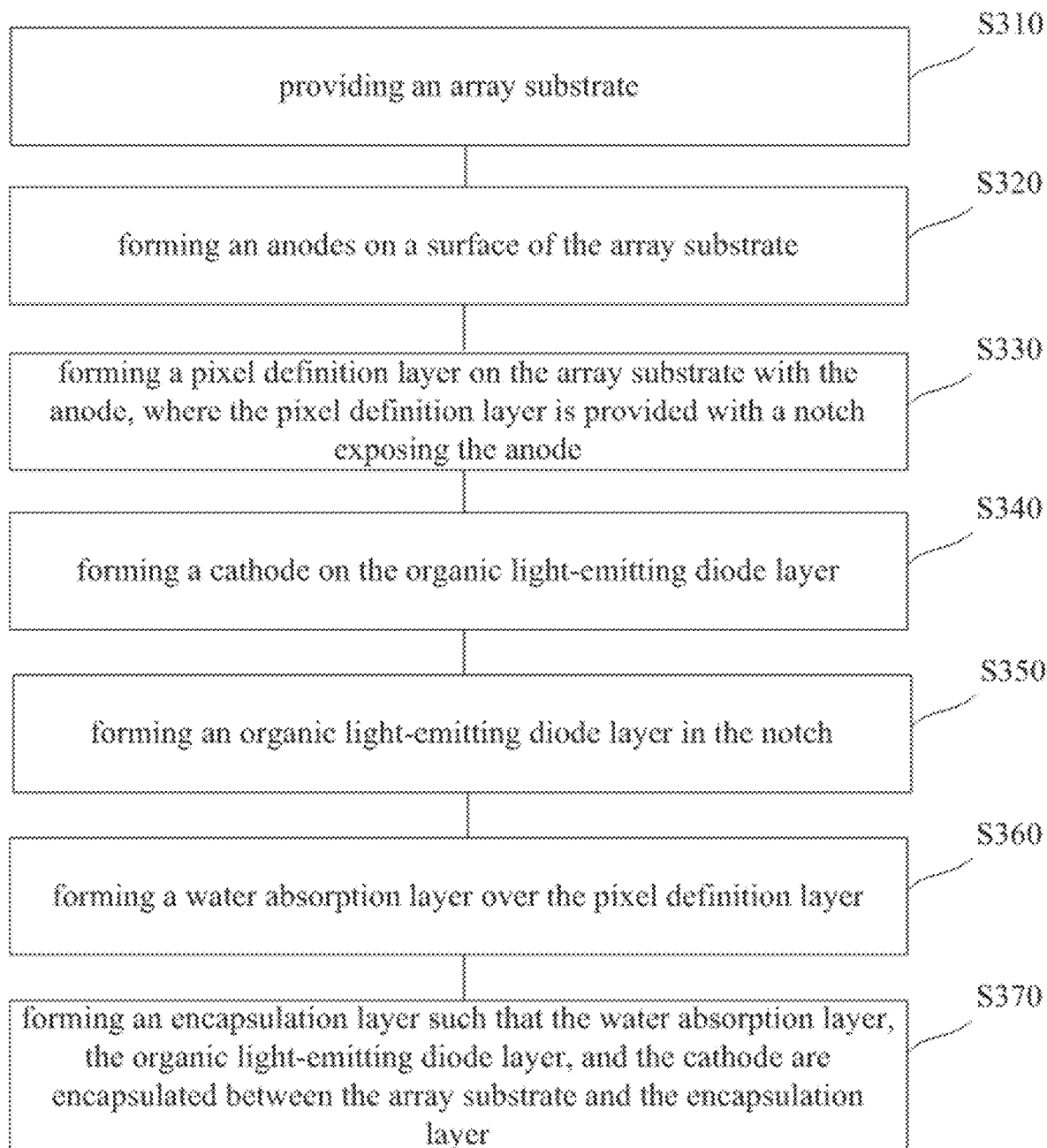
FIG. 3 is a flowchart of a manufacture method of an OLED display panel according to an embodiment of the present disclosure.

Referring to FIG. 3, according to another aspect of the present disclosure, the present disclosure further provides a manufacturer method of the OLED display panel 100, and the specific structure of the OLED display panel 100 is as described above. The manufacture method includes the following steps.

In a step S310, an array substrate id provided.

The array substrate 10 may include a base substrate and a plurality of thin film transistors disposed on the base substrate, and the plurality of thin film transistors may be distributed in an array on the base substrate. The base substrate may be a transparent substrate such as a glass substrate, a silicon substrate, or a plastic substrate. The thin film transistor may be an amorphous silicon thin film transistor, a low temperature polysilicon thin film transistor, or a metal oxide thin film transistor.

In a step S320, a plurality of anodes are formed on a surface of the array substrate.

Alternatively, the anodes 41 may be selected from materials having good electrical and chemical stability, such as indium tin oxide, silver, nickel oxide, graphene, etc., and a thickness of each of the anode 41 may be 1 to 2 µm. Each of the anodes 41 may correspond to one thin film transistor, and the anodes 41 are distributed on the array substrate 10 in an array.

In a step S330, a pixel definition layer 20 is formed on the array substrate with the anodes. The pixel definition layer is provided with a plurality of notches exposing the anodes 41.

The pixel definition layer 20 may be made of a transparent insulating material. For example, the transparent insulating material may be polyimide, silicon nitride, or silicon oxide. The plurality of notches exposing the anodes 41 are provided at positions of the pixel definition layer 20 corresponding to the anodes 41.

In a step S340, an organic light-emitting diode layer is formed in the notch.

Each notch is uniformly provided with an organic light-emitting diode layer 42. The organic light-emitting diode layer 42 includes, but is not limited to, a hole injection layer, a hole transport layer, an organic light-emitting layer, an electron transport layer, and an electron injection layer which are sequentially disposed on the anode 41.

In a step S350, a cathode is formed on the organic light-emitting diode layer.

A cathode 43 is provided on the organic light-emitting diode layer 42. In this embodiment, the cathode 43 may be made of a metal material having high electrical properties, such as metallic silver.

In a step S360, a water absorption layer is formed on the pixel definition layer.

The water absorption layer 51 is configured to remove moisture between the array substrate 10 and the encapsulation layer 30, so that the OLED moisture absorption can be avoided, which is beneficial to a lifespan of the OLED display panel 100. The water absorption layer 51 includes a mixture of at least one of an oxide and a chloride and a water-absorbent resin. The oxide, the chloride, and the water-absorbent resin have a strong absorption capacity for water, and can remove moisture between the array substrate 10 and the encapsulation layer 30. The oxide and the chloride gradually become liquid after absorbing a large amount of moisture, and the liquid easily flow to the organic light-emitting diode layer 42 or the cathode 43. The water-absorbent resin has a good water retention function, and the formed liquid can be kept in the water-absorbent resin, thereby preventing the liquid from flowing to the organic light emitting diode or the cathode 43 to cause damage.

Furthermore, the water-absorbent resin is selected from the group consisting of poly-acrylates, polyvinyl alcohols, polyoxyalkylenes, polyurethanes, general-purpose acrylates, and casein, but is not limited thereto. The oxide includes at least one of calcium oxide and aluminum oxide, which is convenient to obtain and low in cost. The chloride may include at least one of zinc chloride, calcium chloride, and tin chloride, which has strong moisture absorption capacity, can better remove moisture in the OLED display panel 100, and increase the lifespan of the OLED display panel 100.

Before the step S360, the method may further include: forming an adhesive layer 52 on the pixel definition layer 20. The adhesive layer 52 is disposed between the water absorption layer 51 and the pixel definition layer 20, and the adhesive layer 52 is configured to enable the water absorption layer 51 to adhere well to the pixel definition layer 20. The adhesive layer 52 is made of an organic material. In other partial embodiments, the adhesive layer 52 can also be made of an inorganic material.

In a step S370, an encapsulation layer is formed, such that the water absorption layer, the organic light-emitting diode layer, and the cathode are encapsulated between the array substrate 10 and the encapsulation layer 30.

The encapsulation layer 30 may be an encapsulation layer base material, and the encapsulation layer base material includes one of polyethylene terephthalate, polycarbonate, polystyrene, and polymethyl methacrylate. These encapsulation layer base materials can better isolate external moisture and prevent moisture from penetrating into the OLED display panel 100. In other embodiments, the encapsulation layer can also be made of the encapsulation layer base material and the desiccant.

The above description is only preferred embodiments of the present disclosure, and it should be noted that those skilled in the art can also make several improvements and modifications without departing from the principles of the present disclosure. These improvements and modifications should also be considered as the scope of protection of the present disclosure.

The subject matter of the present disclosure can be manufactured and used in the industry, and thus has industrial applicability.

What is claimed is:

1. An organic light-emitting diode (OLED) display panel, comprising:
   an array substrate;
   a pixel definition layer disposed on the array substrate;
   an organic light-emitting diode layer disposed on the array substrate;
   a cathode disposed on the organic light-emitting diode layer;
   an encapsulation layer, wherein the pixel definition layer, the organic light-emitting diode layer, and the cathode are encapsulated between the encapsulation layer and the array substrate; and
   a water absorption layer disposed over the pixel definition layer, wherein the water absorption layer is configured to remove moisture between the array substrate and the encapsulation layer, and wherein the water absorption layer is arranged separately from the organic light-emitting diode layer and the cathode;
   wherein the OLED display panel further comprises an adhesive layer, the adhesive layer is disposed between the water absorption layer and the pixel definition layer, and the adhesive layer is configured to attach the water absorption layer to the pixel definition layer; and
   wherein the water absorption layer comprises a mixture of at least one of an oxide and a chloride and a water-absorbent resin, and the water-absorbent resin is selected from the group consisting of poly-acrylates, polyvinyl alcohols, polyoxyalkylenes, polyurethanes, general-purpose acrylates, and casein.

2. An organic light-emitting diode (OLED) display panel, comprising:
   an array substrate;
   a pixel definition layer disposed on the array substrate;
   an organic light-emitting diode layer disposed on the array substrate;
   a cathode disposed on the organic light-emitting diode layer;
   an encapsulation layer, wherein the pixel definition layer, the organic light-emitting diode layer, and the cathode are encapsulated between the encapsulation layer and the array substrate; and
   a water absorption layer disposed over the pixel definition layer, wherein the water absorption layer is configured to remove moisture between the array substrate and the encapsulation layer, and wherein the water absorption layer is arranged separately from the organic light-emitting diode layer and the cathode.

3. The OLED display panel as claimed in claim 2, wherein the OLED display panel further comprises an adhesive layer, and the adhesive layer is disposed between the water absorption layer and the pixel definition layer, and the adhesive layer is configured to attach the water absorption layer to the pixel definition layer.

4. The OLED display panel as claimed in claim 2, wherein the water absorption layer comprises a mixture of at least one of an oxide and a chloride and a water-absorbent resin.

5. The OLED display panel as claimed in claim 4, wherein the water-absorbent resin is selected from the group consisting of poly-acrylates, polyvinyl alcohols, polyoxyalkylenes, polyurethanes, general-purpose acrylates, and casein.

6. The OLED display panel as claimed in claim 4, wherein the oxide is selected from the group consisting of calcium oxide and aluminum oxide.

7. The OLED display panel as claimed in claim 3, wherein the adhesive layer is made of an organic material.

8. A manufacture method of an OLED display panel according to claim 2, comprising:
   providing an array substrate;
   forming an anodes on a surface of the array substrate;
   forming a pixel definition layer on the array substrate with the anode, wherein the pixel definition layer is provided with a notch exposing the anode;
   forming an organic light-emitting diode layer in the notch;
   forming a cathode on the organic light-emitting diode layer;
   forming a water absorption layer over the pixel definition layer, wherein the water absorption layer is arranged separately from the organic light-emitting diode layer and the cathode; and
   forming an encapsulation layer such that the water absorption layer, the organic light-emitting diode layer, and the cathode are encapsulated between the array substrate and the encapsulation layer.

9. The manufacture method as claimed in claim 8, wherein before the step of forming the water absorption layer over the pixel definition layer, the method further comprises:
   forming an adhesive layer on the pixel definition layer.

10. The manufacture method as claimed in claim 9, wherein the adhesive layer is made of an organic material.

* * * * *